(12) United States Patent
Byrne et al.

(10) Patent No.: US 10,177,507 B2
(45) Date of Patent: Jan. 8, 2019

(54) ELECTRICAL POWER LOAD SWITCH WITH CONNECTION SENSOR

(71) Applicants: Norman R. Byrne, Ada, MI (US); Roger D. Burdi, Grand Rapids, MI (US); Shixiong Li, Grandville, MI (US)

(72) Inventors: Norman R. Byrne, Ada, MI (US); Roger D. Burdi, Grand Rapids, MI (US); Shixiong Li, Grandville, MI (US)

( * ) Notice: Subject to any disclaimer, the term of this patent is extended or adjusted under 35 U.S.C. 154(b) by 79 days.

(21) Appl. No.: 15/428,276

(22) Filed: Feb. 9, 2017

(65) Prior Publication Data

US 2017/0237206 A1     Aug. 17, 2017

Related U.S. Application Data

(60) Provisional application No. 62/294,368, filed on Feb. 12, 2016.

(51) Int. Cl.
*H01R 13/703* (2006.01)
*G01R 33/07* (2006.01)
(Continued)

(52) U.S. Cl.
CPC ........... *H01R 13/703* (2013.01); *G01R 33/07* (2013.01); *G05B 11/01* (2013.01);
(Continued)

(58) Field of Classification Search
None
See application file for complete search history.

(56) References Cited

U.S. PATENT DOCUMENTS

| 2,234,982 A | 3/1941 | Ross |
| 2,573,920 A | 11/1951 | McLeod |

(Continued)

FOREIGN PATENT DOCUMENTS

| FR | 2938383 | 5/2010 |
| WO | 2012036713 | 3/2012 |

(Continued)

OTHER PUBLICATIONS

"MagSafe." Wikipedia, n.d. Web. Feb. 26, 2015. <http://en.wikipedia.org/wiki/MagSafe>, published on or before Feb. 23, 2015.

(Continued)

*Primary Examiner* — Daniel Cavallari
(74) *Attorney, Agent, or Firm* — Gardner, Linn, Burkhart & Ondersma LLP (57) ABSTRACT

An electrical power coupler is configured to convey electrical power upon detecting that a compatible other coupler is properly aligned and no undesirable operating conditions are detected. The power coupler includes a first ferromagnetic metal adjacent a first magnet, a hall sensor for detecting a magnetic field in the first ferromagnetic metal, and at least two first electrical contacts. A control unit is in electrical communication with the power conductors, and includes an electrical switch operable to selectively allow a flow of electricity from a power source through the associated power conductors when the hall sensor detects the magnetic field, such as when the first electrical contacts are in contact with at least two second electrical contacts of another electrical power coupler. The second electrical contacts make contact with the first electrical contacts upon proper alignment of a correspondingly configured other electrical power coupler.

22 Claims, 8 Drawing Sheets

(51) Int. Cl.
  *G05B 11/01* (2006.01)
  *H01R 13/62* (2006.01)
  *H01R 13/66* (2006.01)
  *H01R 13/73* (2006.01)
(52) U.S. Cl.
  CPC ..... *H01R 13/6205* (2013.01); *H01R 13/6675* (2013.01); *H01R 13/6683* (2013.01); *H01R 13/73* (2013.01)

(56) References Cited

U.S. PATENT DOCUMENTS

| | | |
|---|---|---|
| 3,363,214 A | 1/1968 | Wright |
| 3,521,216 A | 7/1970 | Tolegian |
| 3,786,391 A | 1/1974 | Mathauser |
| 3,808,577 A | 4/1974 | Mathauser |
| 3,810,258 A | 5/1974 | Mathauser |
| 3,994,552 A | 11/1976 | Selvin |
| 4,004,298 A | 1/1977 | Freed |
| 4,112,941 A | 9/1978 | Larimore |
| 4,580,862 A | 4/1986 | Johnson |
| 5,037,322 A | 8/1991 | Adams et al. |
| 5,071,363 A | 12/1991 | Reylek et al. |
| 5,199,892 A | 4/1993 | campbell et al. |
| 5,401,175 A | 3/1995 | Guimond et al. |
| 5,481,607 A | 1/1996 | Hsiao |
| 5,752,845 A | 5/1998 | Fu |
| 5,909,100 A | 6/1999 | Watanabe et al. |
| 5,921,783 A | 7/1999 | Fritsch et al. |
| 5,954,520 A | 9/1999 | Schmidt |
| 6,007,344 A | 12/1999 | Corrunker et al. |
| 6,162,062 A | 12/2000 | Liao |
| 6,250,931 B1 | 6/2001 | Mendelson |
| 6,478,614 B1 | 11/2002 | De'Longhi |
| 6,497,579 B1 | 12/2002 | Garbini |
| 6,508,663 B1 | 1/2003 | Uusimaki |
| 6,558,177 B2 | 5/2003 | Havener et al. |
| 6,561,815 B1 | 5/2003 | Schmidt |
| 6,733,317 B2 | 5/2004 | Sato |
| 6,798,227 B1 | 9/2004 | Hwang |
| 6,808,405 B1 | 10/2004 | Uratani et al. |
| 6,984,153 B2 | 1/2006 | Lai et al. |
| 7,059,882 B2 | 6/2006 | Sugita et al. |
| 7,066,739 B2 | 6/2006 | McLeish |
| 7,090,521 B2 | 8/2006 | Nishio et al. |
| 7,249,960 B2 | 7/2007 | Annecke et al. |
| 7,264,479 B1 | 9/2007 | Lee |
| 7,311,526 B2 | 12/2007 | Rohrbach et al. |
| 7,311,541 B2 | 12/2007 | Chien et al. |
| 7,344,380 B2 | 3/2008 | Neidlein et al. |
| 7,351,066 B2 | 4/2008 | DiFonzo et al. |
| 7,404,726 B1 | 7/2008 | Herring et al. |
| 7,462,066 B2 | 12/2008 | Kohen |
| 7,467,948 B2 | 12/2008 | Lindenberg et al. |
| 7,500,862 B1 | 3/2009 | Herring et al. |
| 7,500,882 B2 | 3/2009 | Goetz et al. |
| 7,517,222 B2 | 4/2009 | Rohrbach et al. |
| 7,607,920 B1 | 10/2009 | Chen |
| 7,641,476 B2 | 1/2010 | Didur et al. |
| 7,641,477 B2 | 1/2010 | DiFonzo et al. |
| 7,645,143 B2 | 1/2010 | Rohrbach et al. |
| 7,658,612 B2 | 2/2010 | Lee et al. |
| 7,658,613 B1 | 2/2010 | Griffin et al. |
| 7,726,974 B2 | 6/2010 | Shah et al. |
| 7,741,806 B2 | 6/2010 | Kuhlmann et al. |
| 7,775,801 B2 | 8/2010 | Shiff et al. |
| 7,841,776 B2 | 11/2010 | DiFonzo et al. |
| 7,841,865 B2 | 11/2010 | Maughan et al. |
| 7,901,216 B2 | 3/2011 | Rohrbach et al. |
| 7,963,774 B2 | 6/2011 | Shiff et al. |
| 8,022,664 B2 | 9/2011 | Shu |
| 8,087,939 B2 | 1/2012 | Rohrbach et al. |
| 8,105,091 B2 | 1/2012 | Nishihira et al. |
| 8,143,983 B1 | 3/2012 | Lauder et al. |
| 8,177,560 B2 | 5/2012 | Rohrbach et al. |
| 8,242,868 B2 | 8/2012 | Lauder et al. |
| 8,251,705 B2 | 8/2012 | Nishihira et al. |
| 8,366,469 B2 | 2/2013 | Carnevali |
| 8,382,486 B2 | 2/2013 | Lee et al. |
| 8,398,409 B2 | 3/2013 | Schmidt |
| 8,410,753 B2 | 4/2013 | Opolka |
| 8,435,042 B2 | 5/2013 | Rohrbach et al. |
| 8,514,042 B2 | 8/2013 | Lauder et al. |
| 8,529,274 B2 | 9/2013 | Li et al. |
| 8,535,088 B2 | 9/2013 | Gao et al. |
| 8,596,881 B2 | 12/2013 | Umeno |
| 8,602,795 B2 | 12/2013 | Hsu |
| 8,622,629 B1 | 1/2014 | Umeno |
| 8,651,711 B2 | 2/2014 | Rudisill et al. |
| 8,651,879 B2 | 2/2014 | Stiehl et al. |
| 8,672,228 B1 | 3/2014 | Saini |
| 8,680,709 B2 | 3/2014 | Byrne et al. |
| 8,690,582 B2 | 4/2014 | Rohrbach et al. |
| 8,696,366 B2 | 4/2014 | Chen et al. |
| 8,702,316 B2 | 4/2014 | DiFonzo et al. |
| 8,734,165 B2 | 5/2014 | Neel |
| 8,770,857 B2 | 7/2014 | DiFonzo et al. |
| 8,790,120 B2 | 7/2014 | Wang et al. |
| 8,888,500 B2 | 11/2014 | Gao et al. |
| 8,915,609 B1 | 12/2014 | Shah et al. |
| 8,992,241 B2 | 3/2015 | Genest et al. |
| 9,004,930 B2 | 4/2015 | Gualino et al. |
| 9,484,751 B2 | 11/2016 | Byrne et al. |
| 9,531,118 B2 | 12/2016 | Byrne et al. |
| 2005/0082915 A1 | 4/2005 | Steinberg |
| 2005/0170672 A1 | 8/2005 | Lai et al. |
| 2006/0152945 A1 | 7/2006 | Lantzsch et al. |
| 2007/0254510 A1 | 11/2007 | DeBey |
| 2008/0090432 A1 | 4/2008 | Patterson et al. |
| 2009/0239392 A1 | 9/2009 | Sumitomo et al. |
| 2010/0144164 A1 | 6/2010 | Wang et al. |
| 2011/0028006 A1 | 2/2011 | Shah et al. |
| 2012/0028505 A1 | 2/2012 | Weber et al. |
| 2012/0049931 A1 | 3/2012 | Yamada |
| 2012/0177322 A1 | 7/2012 | Schwandt et al. |
| 2012/0177323 A1 | 7/2012 | Schwandt et al. |
| 2012/0177324 A1 | 7/2012 | Schwandt et al. |
| 2012/0177325 A1 | 7/2012 | Schwandt et al. |
| 2012/0183258 A1 | 7/2012 | Schwandt et al. |
| 2012/0183259 A1 | 7/2012 | Schwandt et al. |
| 2012/0183260 A1 | 7/2012 | Schwandt et al. |
| 2012/0183261 A1 | 7/2012 | Schwandt et al. |
| 2012/0183262 A1 | 7/2012 | Schwandt et al. |
| 2012/0189155 A1 | 7/2012 | Gabara |
| 2012/0206090 A1 | 8/2012 | Hyun-Jun et al. |
| 2012/0252231 A1 | 10/2012 | Kall |
| 2012/0295451 A1 | 11/2012 | Hyun-Jun et al. |
| 2012/0322323 A1 | 12/2012 | Fowler |
| 2013/0040470 A1 | 2/2013 | Gao et al. |
| 2013/0050958 A1 | 2/2013 | Bdeir |
| 2013/0076328 A1* | 3/2013 | Sip ............... H01R 13/6205 323/304 |
| 2013/0088186 A1 | 4/2013 | Hsieh |
| 2013/0210244 A1 | 8/2013 | DiFonzo et al. |
| 2013/0323941 A1 | 12/2013 | Zeliff et al. |
| 2013/0343025 A1 | 12/2013 | Bdeir |
| 2014/0011375 A1 | 1/2014 | Lin |
| 2014/0049911 A1 | 2/2014 | Corbin et al. |
| 2014/0065846 A1 | 3/2014 | Poh et al. |
| 2014/0087569 A1 | 3/2014 | Lee |
| 2014/0087581 A1 | 3/2014 | Umeno |
| 2014/0099801 A1 | 4/2014 | Liao |
| 2014/0120746 A1 | 5/2014 | Persion et al. |
| 2014/0148018 A1 | 5/2014 | Kim |
| 2014/0153265 A1 | 6/2014 | Rudisill et al. |
| 2014/0162468 A1 | 6/2014 | Kim |
| 2014/0170864 A1 | 6/2014 | Hwang |
| 2014/0179126 A1 | 6/2014 | Gao et al. |
| 2014/0187057 A1 | 7/2014 | Murtagian et al. |
| 2014/0192494 A1 | 7/2014 | Liang et al. |
| 2014/0302691 A1* | 10/2014 | Janfada ............ H01R 13/629 439/39 |
| 2015/0071675 A1 | 3/2015 | Suzaki |
| 2015/0118868 A1 | 4/2015 | Choi et al. |

(56) References Cited

U.S. PATENT DOCUMENTS

| | | |
|---|---|---|
| 2015/0171649 A1 | 6/2015 | Kim et al. |
| 2015/0194764 A1 | 7/2015 | Magana et al. |
| 2015/0255981 A1 | 9/2015 | Byrne et al. |

FOREIGN PATENT DOCUMENTS

| | | |
|---|---|---|
| WO | 2012036716 | 3/2012 |
| WO | 2012078526 | 6/2012 |
| WO | 2012106215 | 8/2012 |
| WO | 2012158616 | 11/2012 |
| WO | 2013003781 | 1/2013 |
| WO | 2013022899 | 2/2013 |
| WO | 2013165049 | 11/2013 |
| WO | 2014010781 | 1/2014 |
| WO | 2014021847 | 2/2014 |
| WO | 2015168221 | 11/2015 |

OTHER PUBLICATIONS

"Magnetic Connector Power Cord", <http://www.alibaba.com/showroom/magnetic-power-connector.html>, published on or before Feb. 26, 2015.

* cited by examiner

ELECTRICAL POWER LOAD SWITCH WITH CONNECTION SENSOR

CROSS-REFERENCE TO RELATED APPLICATION

The present application claims the benefit of U.S. provisional application, Ser. No. 62/294,368, filed Feb. 12, 2016, which is hereby incorporated herein by reference in its entirety.

FIELD OF THE INVENTION

The present invention is directed to furniture-integrated electrical circuits and, more particularly, to electrical circuit couplers and connection sensors.

BACKGROUND OF THE INVENTION

Conventional electrical circuits provide a variety of interconnections and flexibility. Electrical circuits may be embedded into walls and integrated into furniture, such as office furniture. These embedded and integrated electrical circuits typically include outlets or other similar interconnection terminals such that accessory appliances (e.g., lamps and personal electrical appliances including portable electronic devices) may be plugged into an outlet. Circuits integrated into furniture may also interconnect with electrical circuits embedded into walls, dividers, floors, and ceilings of a room to extend the electrical circuit of the room into the furniture.

SUMMARY OF THE INVENTION

The present invention provides for selectively coupling a power output of a power source to exposed electrical contacts of a mounted power coupler when the electrical contacts of another power coupler are aligned with the electrical contacts of the mounted power coupler. This permits multiple compatible electrical systems to be electrically coupled or "ganged" together, such as by placing furniture articles supporting the electrical systems into a side-by-side or end-to-end arrangement with compatible couplers in proper alignment and electrical engagement with one another. Controllers detect when an appropriate connection has been made, and then close respective switches to conduct electrical power from an upstream power source to one or more downstream electrical outlets of one or more downstream electrical systems.

According to an aspect of the present invention, an electrical power coupler includes a first ferromagnetic metal adjacent to a first magnet, a hall sensor operable to detect a magnetic field in the first ferromagnetic metal, and at least two first electrical contacts, each first contact coupled to a respective one of at least two power conductors that are coupled to a power source. A control unit is in electrical communication with the power conductors, and includes an electrical switch associated with at least one of the power conductors. The switch is operable to selectively allow a flow of electricity through the associated power conductor(s) when the hall sensor detects the magnetic field. The hall sensor detects the magnetic field when the first electrical contacts are in contact with two second electrical contacts of another electrical power coupler. The second electrical contacts make contact with the first electrical contacts when the first magnet is aligned with a second ferromagnetic metal of the other electrical power coupler and when a second magnet of the other electrical power coupler is aligned with the first ferromagnetic metal.

According to another aspect of the present invention, an electrical power distribution system includes a first power coupler including a first ferromagnetic metal adjacent to a first magnet, a hall sensor operable to detect a magnetic field in the first ferromagnetic metal, and two first electrical contacts. Each first contact is coupled to a respective one of two power conductors coupled to a power source. The system includes a control unit in electrical communication with the power conductors of the first power coupler. The control unit includes an electrical switch associated with at least one of the power conductors, and is operable to selectively allow a flow of electricity through the power conductors when the hall sensor detects the magnetic field. A power cable assembly comprises a second power coupler that includes two second electrical contacts. The second power coupler is at an end portion of the power cable assembly, and further includes a second ferromagnetic metal adjacent to a second magnet. The hall sensor is operable to detect the magnetic field when the second electrical contacts are coupled to the first electrical contacts. Coupling the second electrical contacts to the first electrical contacts axially aligns the first magnet with the second ferromagnetic metal and the second magnet with the first ferromagnetic metal.

According to yet another aspect of the present invention, a method for selectively powering an electrical power distribution system includes aligning a first ferromagnetic metal and a first magnet of a first power coupler to a second magnet and a second ferromagnetic metal, respectively, of a second power coupler. The method includes measuring a first magnetic field strength in the second ferromagnetic metal. The first magnetic field strength is compared to a first threshold. Power is selectively connected via a power source to the second electrical contacts of the second power coupler when the first magnetic field strength is above the first threshold.

Optionally, the first magnetic field strength is measured with a Hall Effect sensor ("hall sensor"), which is operable to output a signal to the control unit when the measured magnetic field is above the first threshold level. For example, the measured magnetic field may be above the first threshold level when the second electrical contacts are axially aligned with the first electrical contacts.

The power cable assembly may further include at least two second power conductors coupled to the second electrical contacts and an accessory power outlet operable to supply power to personal electronic devices via the second power conductors. The power source may provide direct current (DC) power. The power cable assembly may further include a third power coupler at an opposite end portion of the power cable assembly from the second power coupler. The third power coupler may include at least two third electrical contacts, a third ferromagnetic metal adjacent to a third magnet, and a third Hall Effect sensor operable to detect a magnetic field from the third ferromagnetic metal. The first power coupler may also include the first control unit. The power cable assembly may be integrated into or disposed along an article of furniture.

The second power coupler may further include a second Hall Effect sensor and a second control unit. The second Hall Effect sensor may be operable to detect a second magnetic field from the second ferromagnetic metal. The second control unit may be further operable to selectively allow a flow of electricity through the second power conductors via a second electrical switch associated with at least one of the second power conductors when the second Hall Effect sensor detects the second magnetic field.

The first control unit may be further operable to measure a current in the first power conductors and further yet operable to selectively prevent the flow of electricity through the first power conductors when a measured current is above a current threshold.

These and other objects, advantages, purposes and features of this invention will become apparent upon review of the following specification in conjunction with the drawings.

DESCRIPTION OF THE PREFERRED EMBODIMENTS

The present disclosure will now be described with reference to the accompanying figures, wherein the numbered elements in the following written description correspond to like-numbered elements in the figures.

As discussed herein, exemplary embodiments provide for selectively coupling a power output of a power source to exposed electrical contacts of a mounted power coupler when the electrical contacts of another power coupler are aligned with the electrical contacts of the mounted power coupler.

Figure 1:
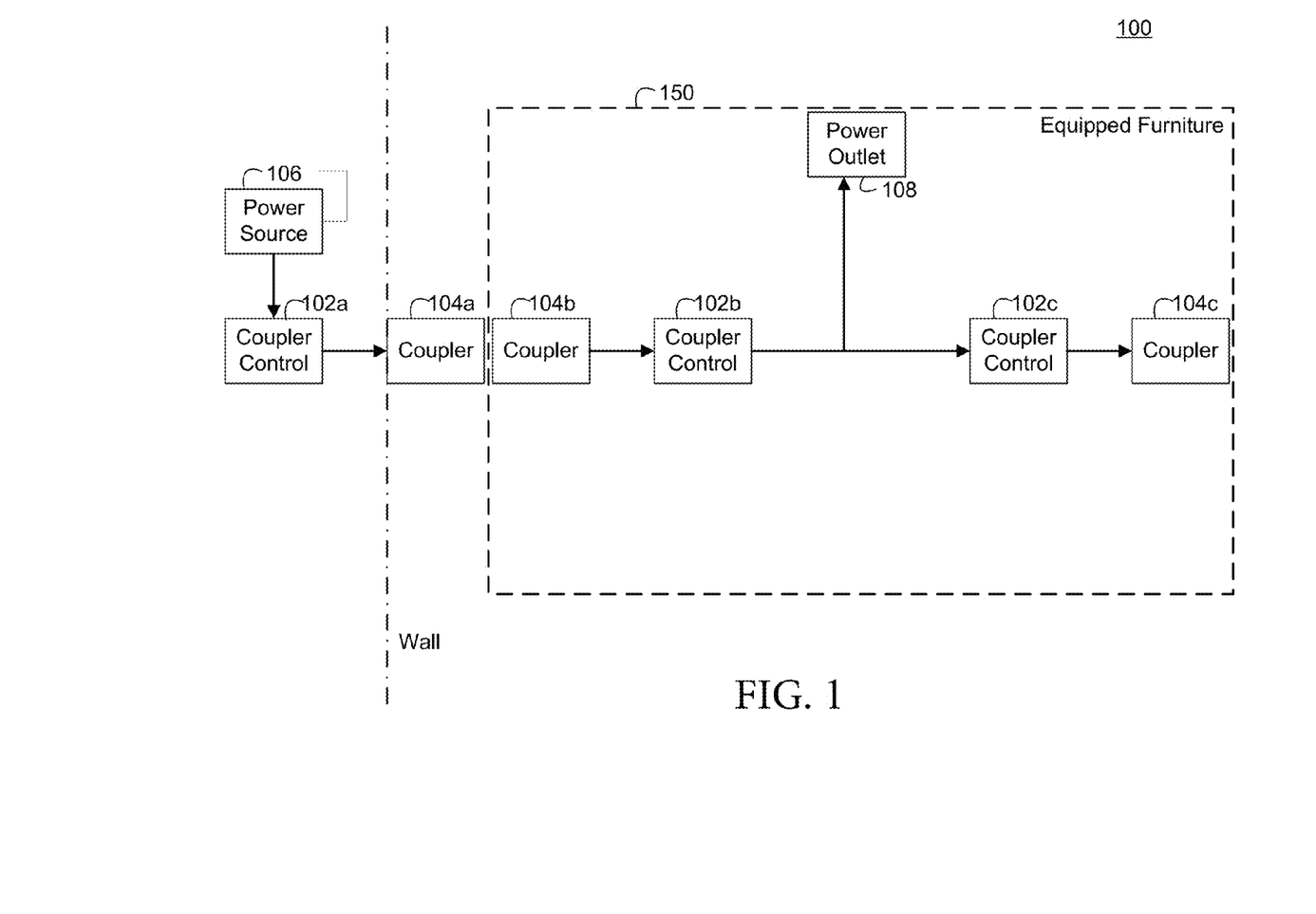
FIG. 1 is a block diagram illustrating an electrical power distribution system in accordance with an embodiment of the present disclosure.

As illustrated in FIG. 1, an electrical power distribution system 100 includes a wall-mounted coupler 104a connected via a coupler control 102a to a power source 106 (e.g., power supplies or power received from other sources such as electrical mains). As illustrated in FIG. 1, an equipped furniture article 150 includes a pair of couplers 104b, 104c positioned on opposite ends of the equipped furniture article 150. Each of the couplers 104b, 104c is also electrically connected to a respective coupler control 102b, 102c. FIG. 1 also illustrates that a power outlet 108 is positioned along a working surface of the equipped furniture article 150. In an aspect of the present invention, the power source 106 and the wall-mounted coupler 104a are interconnected by power conductors via the coupler control 102a. The furniture article couplers 104b, 104c, and power outlet 108 are similarly interconnected by power conductors via coupler controls 102b, 102c.

Figure 2A:
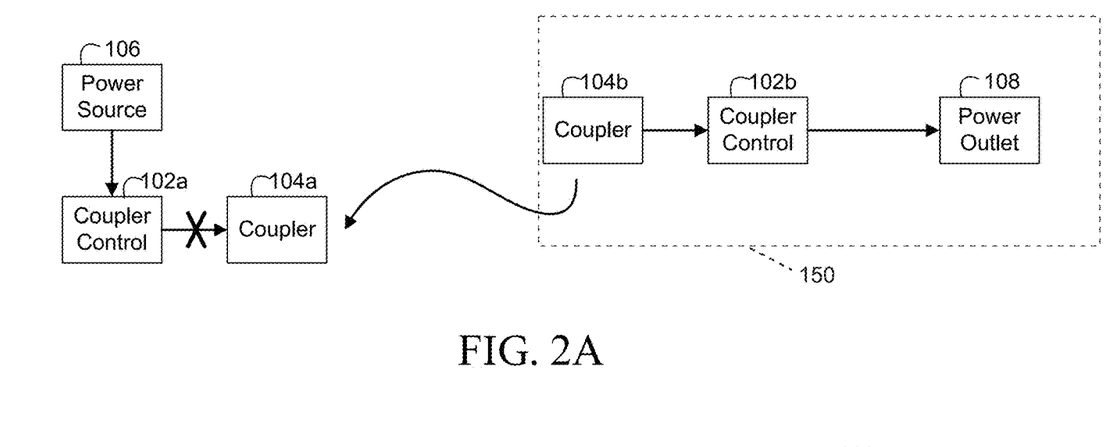
FIGS. 2A and 2B are block diagrams further illustrating the interconnections of the electrical power distribution system of FIG. 1.
Figure 2B:
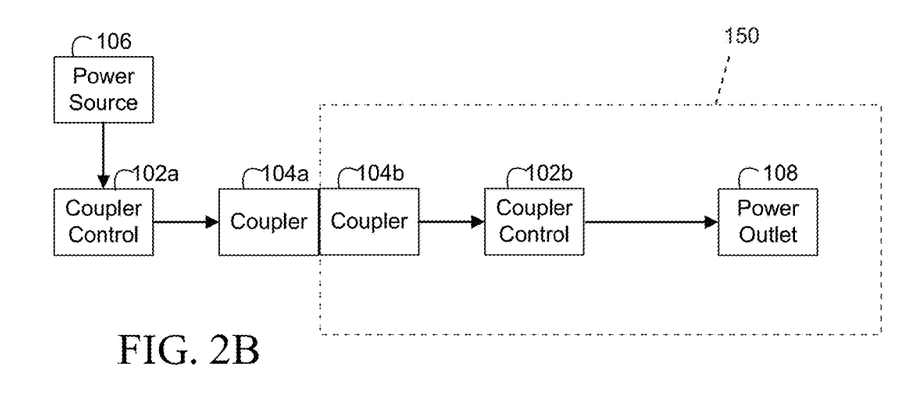

When the equipped furniture article 150 is positioned away from the wall (FIG. 2A), the first furniture coupler 104b will also be positioned away from the wall coupler 104a. When first furniture coupler 104b is positioned away from wall coupler 104a, the wall coupler control 102a disconnects the power source 106 from the wall coupler 104a. Similarly, second furniture coupler control 102c, illustrated in FIG. 1, disconnects the second furniture coupler 104c because there is no additional coupler aligned with second coupler 104c. As also illustrated in FIG. 1 and FIG. 2B, when the couplers 104a and 104b are aligned together, the coupler control 102a selectively connects the power source 106 to the coupler 104a and the coupler control 102b connects the power outlet 108 to the coupler 104b, and through couplers 104a and 104b, to the power source 106.

In an aspect of the present invention, as discussed herein, wall coupler control 102a and the first and second furniture coupler controls 102b, 102c are also operable to disconnect their respective couplers (104a, 104b, and 104c) when a measured current exceeds a predetermined level. A maximum current level may be determined with respect to a reliability of electrical contacts, wire gauge, etc. In a further aspect of the present invention, wall coupler control 102a may be modified as disclosed in commonly owned U.S. Pat. No. 8,680,709, the disclosure of which is hereby incorporated herein by reference. As discussed in the '709 patent, the wall coupler control 102a may be modified to automatically limit a number of cable assemblies or equipped furniture articles 150 that may be energized in a chain from a power source 106 based upon a sensed voltage reading. The chain of power cable assemblies and/or equipped furniture articles 150 changes the sensed voltage reading in a predictable manner corresponding to the number of power cable assemblies or equipped furniture articles 150 that are energized in the chain from the power source 106.

In a further aspect of the present invention, as discussed herein, the wall coupler control 102a and the first and second furniture coupler controls 102b, 102c are also operable to disconnect their respective couplers (104a, 104b, and 104c) when one of the first and second furniture couplers 104b, 104c is coupled to another power source. As discussed herein, the wall coupler control 102a and the first and second furniture coupler controls 102b, 102c are operable to disconnect their respective couplers (104a, 104b, and 104c) when an over-current condition is detected. In a further aspect of the present invention, the wall coupler control 102a may be further modified as disclosed in commonly owned U.S. Patent Application Publication No. 2015/0255981, the disclosure of which is hereby incorporated herein by reference. As discussed in the '981 application, the wall coupler control 102a may be modified to isolate the power source 106 from any equipped furniture article(s) 150 until it is established that the equipped furniture article(s) 150 are not already being supplied with electrical power from another source.

Figure 3:
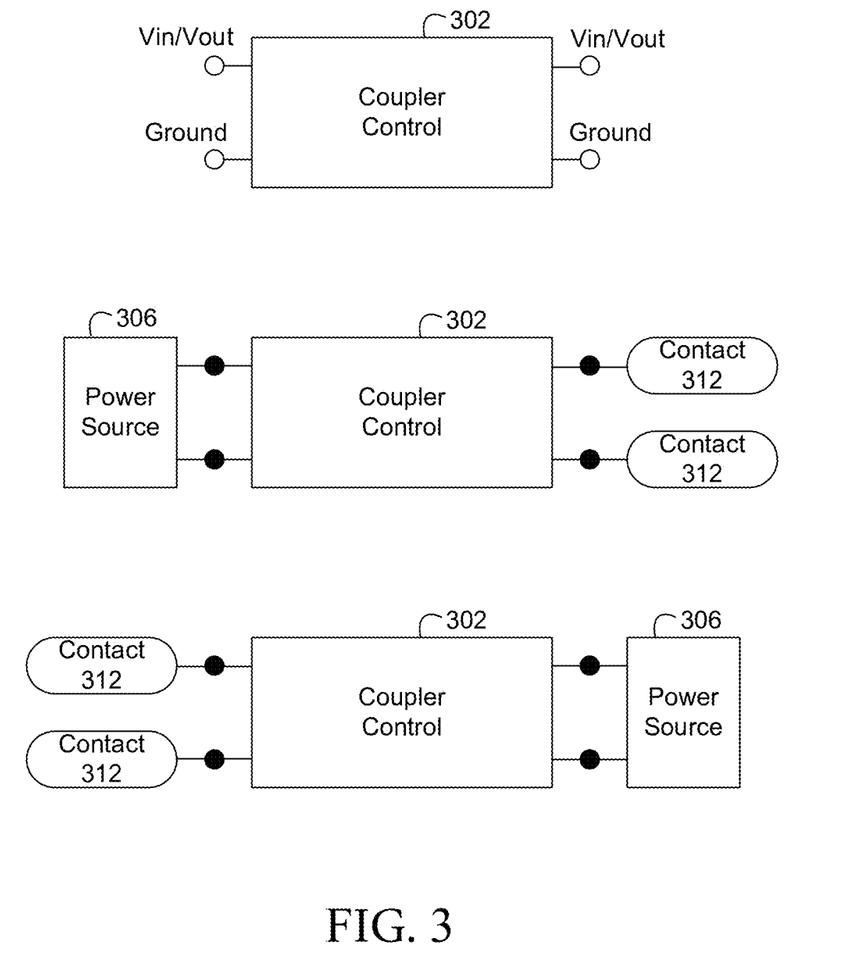
FIG. 3 is a block diagram of the interconnections of a coupler control in accordance with an embodiment of the present disclosure.

In an aspect of the present invention illustrated in FIG. 3, an exemplary coupler control 302 includes a pair of input/output connections on either side. As illustrated in FIG. 3, a power source 306 may be attached to either pair of connections of the coupler control 302, while a pair of electrical contacts 312 may be similarly attached to the opposite connections of the coupler control 302. Therefore, a single coupler control unit 302 may be used in either direction (In/Out), without the need for developing and producing a right-handed embodiment and a left-handed embodiment. In other words, as illustrated in FIGS. 1, 2A, and 2B, a coupler control may input power in either direction and output that power in the opposite direction.

Figure 4A:
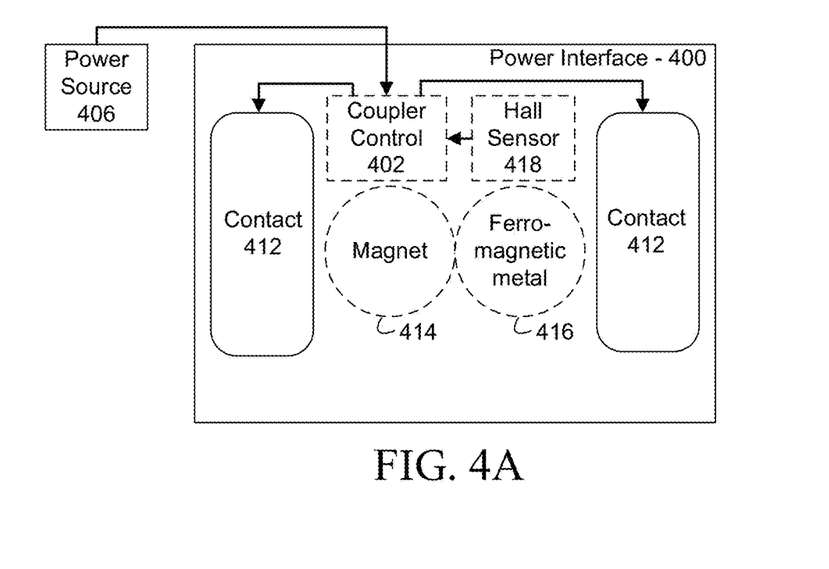
FIGS. 4A, 4B, and 4C are block diagrams illustrating a power coupler and aligning power couplers in accordance with an embodiment of the present disclosure.
Figure 4B:
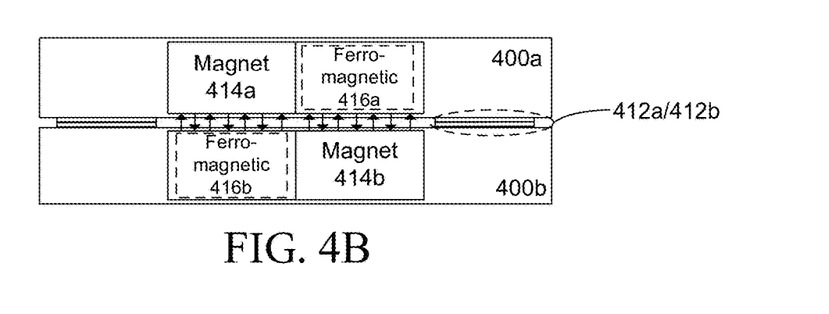

FIG. 4A illustrates a block diagram of an exemplary power interface or coupler 400 that incorporates a pair of electrical contacts 412. The power coupler 400 positions a magnet 414 and a ferromagnetic metal 416 behind the electrical contacts 412. The ferromagnetic metal 416 is also paired with a Hall Effect sensor 418. The ferromagnetic metal 416 may comprise any metal that is magnetically attracted to a magnetic force (e.g., iron and some steel alloys). As illustrated in FIGS. 4A and 4B, the magnet 414 and ferromagnetic metal 416 are positioned such that when the electrical contacts 412a, 412b of a pair of power couplers 400a, 400b are axially aligned so that their respective electrical contacts 412a, 412b are in contact, the magnet 414a of a power coupler 400a is aligned with a ferromagnetic metal 416b of the adjacent power coupler 400b and the ferromagnetic metal 416 of power coupler 400a is aligned with magnet 414b of the adjacent power coupler 400b.

As illustrated in FIG. 4B, when a ferromagnetic metal 416a of a power coupler 400a is aligned with a magnet 414b of another closely positioned and aligned power coupler 400b, a magnetic field will be established in the ferromagnetic metal 416a when the magnet 414b and the ferromagnetic metal 416a are magnetically attracted to each other and latch together. As illustrated in FIGS. 4A and 4B, this induced magnetic field may be detected by a Hall Effect sensor 418 positioned near the ferromagnetic metal 416a. As illustrated in FIG. 4A, when the induced magnetic field is detected by the Hall Effect sensor 418, an output signal from the Hall Effect sensor 418 is received by a coupler control 402. In one aspect of the present invention, an exemplary Hall Effect sensor 418 may output a signal when the electrical contacts 412 of a pair of power couplers 400 are aligned and centered with each other within 5 to 7 millimeters in the X and Y direction. Such alignment may ensure a maximum contact area between adjacent power coupler electrical contacts 412, thus minimizing contact resistance.

As illustrated in FIG. 4A, the power source 406 is electrically coupled to the electrical contacts 412 by the coupler control 402 when the output signal is received from the Hall Effect sensor 418. However, it will be appreciated that that the opposite is also true, i.e., the power source 406 is not electrically coupled to the electrical contacts 412 by the coupler control 402 when the output signal is not received from the Hall Effect sensor 418. In other words, the power source 406 is only coupled to the electrical contacts 412 when an output from the Hall Effect sensor 418 is received by the coupler control 402.

Figure 4C:
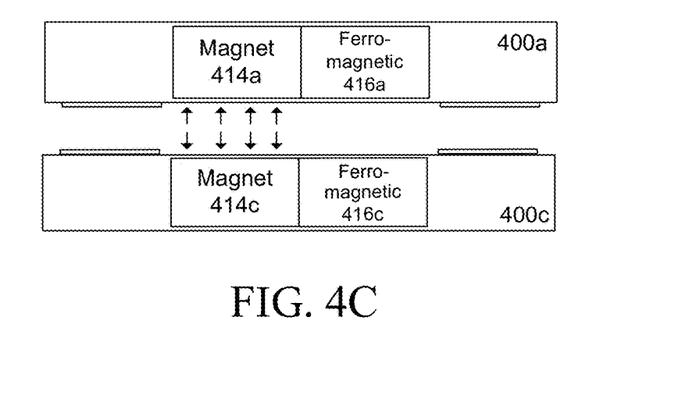

FIG. 4C illustrates what happens when power coupler 400c is installed backwards or inverted (where magnet 414c and ferromagnetic metal 416c are reversed). In such a condition, when the improperly installed power coupler 400c is positioned near, and aligned with another power coupler 400a, the magnet 414c of the improperly installed power coupler 400c is repelled by the magnet 414a of the other power coupler 400a. Therefore, the magnet 414 and ferromagnetic metal 416 of a power coupler 400 can "detect" or react to a power coupler 400 installed backwards, and thereby prevent reverse polarity connections that could have resulted with improperly installed power couplers. Because a magnetic field will not be induced into a power coupler's ferromagnetic metal 416 under these conditions, the Hall Effect sensor 418 will not output a signal to the coupler control 402 to couple the power source 406 to the electrical contacts 412.

Figure 5A:
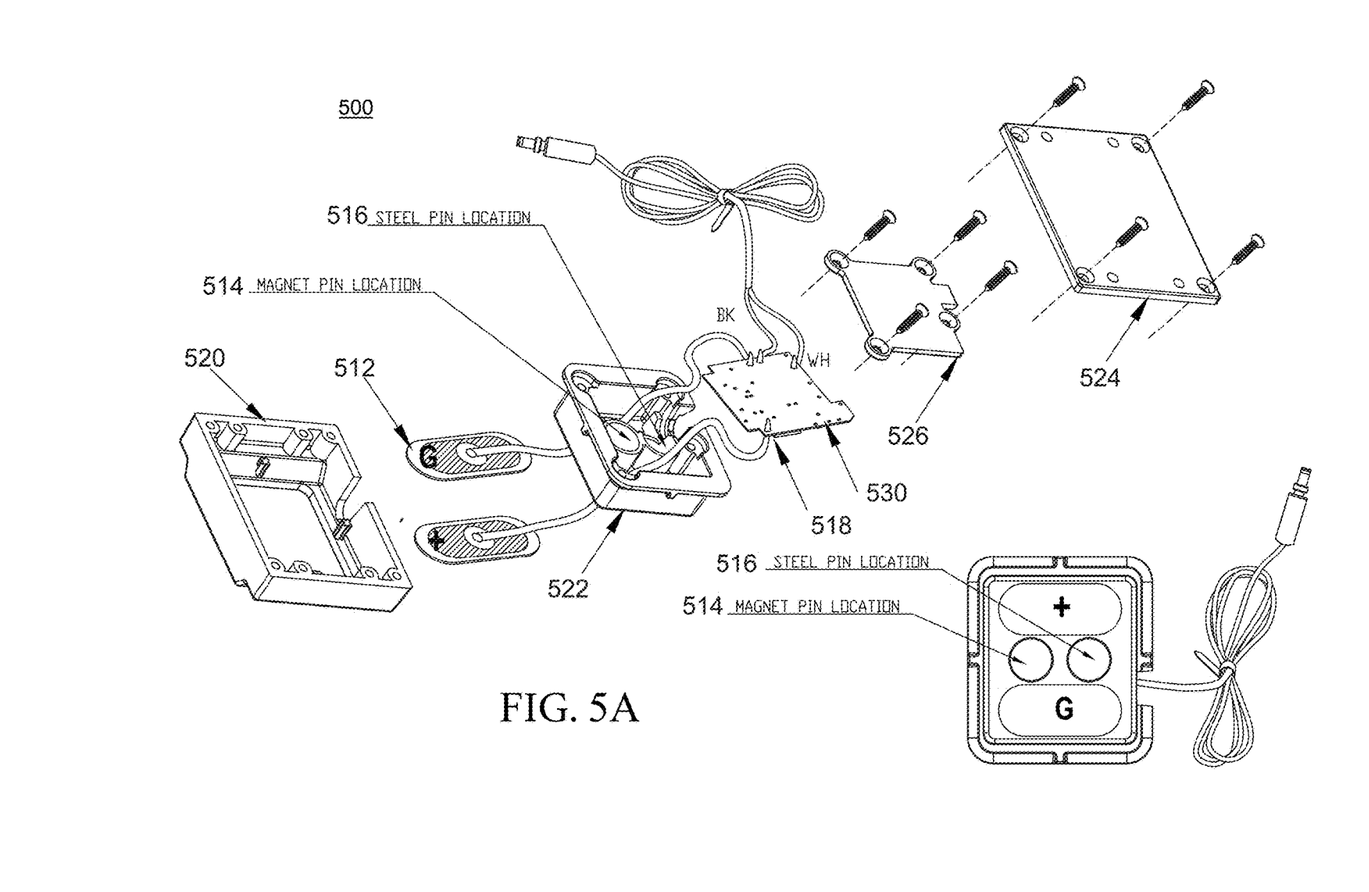
FIG. 5A is an exploded view of the components of a power coupler in accordance with an embodiment of the present disclosure.

As illustrated in FIG. 5A, an exemplary power coupler 500 includes a magnet 514 and ferromagnetic metal 516 that are positioned in an inner housing 522, which is placed into an outer housing 520. A panel 526 encloses the magnet 514 and ferromagnetic metal 516 in the inner housing 522, while another panel 524 encloses the inner housing 520 along with a PCB assembly 530 in the outer housing 520. The PCB assembly 530 is in electrical contact with a pair of electrical contacts 512 and a power source (not illustrated). The electrical contacts 512 are mounted so as to be exposed along an exterior surface of the outer housing 520. FIG. 5A also illustrates that a Hall Effect sensor 518 may be placed on a bottom side of the PCB assembly 530. The Hall Effect sensor 518 is placed in close proximity to the ferromagnetic metal 516 to detect any induced magnetic field in the ferromagnetic metal 516.

Figure 5B:
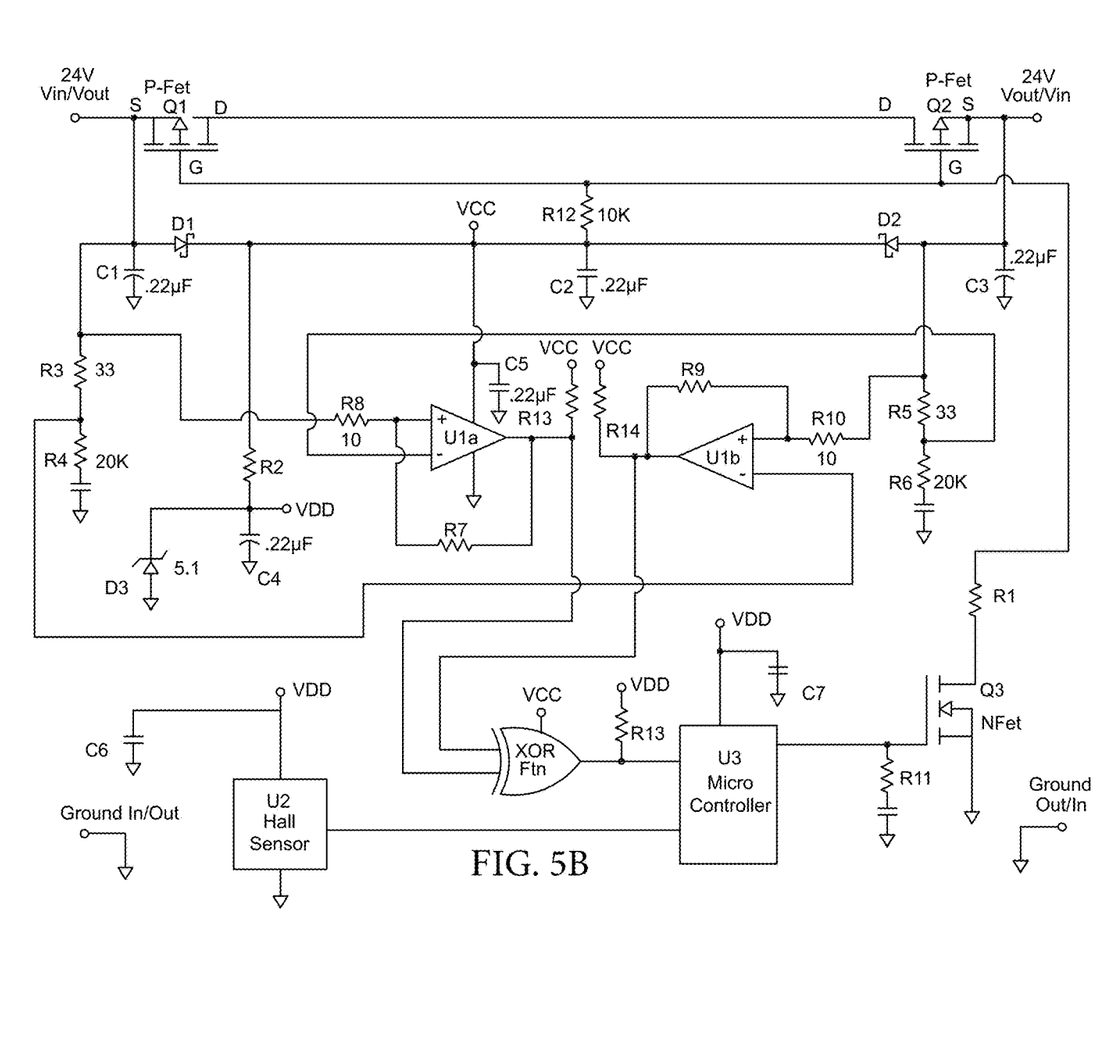
FIG. 5B is a schematic of the circuit on the PCB assembly illustrated in FIG. 5A in accordance with an embodiment of the present disclosure.

FIG. 5B illustrates an exemplary schematic for a PCB assembly 530 which comprises a Hall Effect sensor 518 and the functionality of the coupler control 302 illustrated in FIG. 3. As illustrated in FIG. 5B, the coupler control circuitry comprises a pair of Vin/Vout points on opposite sides of the circuit. Similarly, the coupler control circuitry also comprises a pair of ground points on opposite sides of the circuit.

A power supply formed by the interconnections of diodes D1 and D2, resistors R2 and R3, and capacitor C4 deliver a regulated DC voltage to power a Hall Effect sensor U2 (518) and microcontroller U3 (which performs the functionality of a coupler control). As discussed herein, the Hall Effect sensor U2, illustrated in FIG. 5B, is selected to have a correct sensitivity to detect a magnetic field of an adjacent ferromagnetic metal when a magnet is aligned properly with the ferromagnetic metal.

The Hall Effect sensor U2 signals the microcontroller U3 when that desired proper alignment is detected. In an aspect of the present invention, the microcontroller U3 is provided with a de-bounce delay to prevent contact chatter when electrical contacts make first contact. This insures that electrical contacts are closed and stable before a load switch is turned ON. The microcontroller U3 will also keep the load switch ON for a short period of time in the event the electrical contacts bounce when the power couplers are separating and their electrical contacts are opening.

Once a stable contact closure has been detected by the Hall Effect sensor U2 and the microcontroller U3, as illustrated in FIG. 5B, the microcontroller U3 will turn on transistor Q3. When transistor Q3 turns on, transistors Q1 and Q2 will also turn on and supply electrical power. As discussed herein, and illustrated in FIGS. 1 and 3, a power source 106 may be passed on to electrical contacts 312, or a power source may be passed on to power outlets 108 and/or a power coupler downstream.

In an aspect of the present invention, transistors Q1 and Q2 are PFET-type transistors and may therefore supply current in both directions. Thus, as illustrated in FIG. 3, and discussed herein, the coupler circuit illustrated in FIG. 5B is not right- or left-handed. Therefore, there is no need to have an upstream power coupler and a downstream power coupler. Such configuration may provide improved ease of use and minimal planning, as well as reduced SKU's for customers.

As also illustrated in FIG. 5B, comparators U1a and U2a, along with resistors R3, R4, R5, R6, R7, R8, R9, and R10 are configured to measure the voltage drop across PFET transistors Q1 and Q2 channel resistance, Rdson. Since transistors Q1 and Q2 are FETs, current passing through transistors Q1 and Q2 will generate a voltage drop that is proportional to the current passing through the channel resistance of the PFET transistors Q1 and Q2. The comparators, U1a and U1b, along with resistors R3, R4, R5, R6, R7, R8, R9, and R10 are configured to switch state (that is, a logical 0 is changed to a logical 1, and vice versa), and also provide a sufficient hysteresis when the current exceeds a predetermined level to prevent current from exceeding a maximum level allowed. In an aspect of the present invention, the maximum level may be determined with respect to the reliability of electrical contacts 412, wire gauge, etc.

The resistors R3/R4 and R5/R6 set the reference voltages used by comparators U1a and U1b. As current passes through transistors Q1 and Q2, a voltage is developed across the channel resistances (Rdson) of transistors Q1 and Q2. The voltage drops across transistors Q1 and Q2 are fed into comparators U1a and U1b via resistors R8 and R10, respectively. Resistors R8/R7 and R10/R9 set the hysteresis of the comparators U1a and U1b. The maximum current level is set by the voltage level set by the voltage dividers R3/R4 and R5/R6. Increasing the resistance of R3 and R5 will increase the amount of current flow through transistors Q1 and Q2 before an over-current circuit protection function trips and signals microcontroller U3.

As illustrated in FIG. 5B, two comparators U1a and U1b are used so the circuit can measure and detect current flow in either direction and thus allow the coupler control to work bi-directionally. If microcontroller U3 detects an over-current condition, microcontroller U3 will turn off transistor Q3, thus turning off the pass or switch transistors Q1 and Q2. The microcontroller U3 will keep transistors Q1 and Q2 turned off for a set period of time and retry the connection. If the over-current is detected again, the microcontroller U3 will turn off the pass/switch transistors Q1 and Q2 again (via transistor Q3). This iteration will continue until the over-current condition is removed. In an aspect of the present invention, a duty cycle may be set low enough to prevent any appreciable power dissipation and overheating of the system in the event of an over-current condition.

As also illustrated in FIG. 5B, capacitors C1, C2, C3, C5, C6, and C7 are used for noise decoupling. Resistor R12 is used to keep the transistors Q1 and Q2 turned off until transistor Q3 is turned on, and to improve noise immunity. Resistor R11 is used to keep transistor Q3 turned off until microcontroller U3 applies a logical 1 to transistor Q3's gate, and improves noise immunity. Resistors R13, R14 form a simple pull-up resistor, and may not be needed depending on which microcontroller U3 is used. Finally, diodes D1 and D2 and capacitor C2 is used to provide a higher voltage power supply needed by comparator U1.

Figure 6:
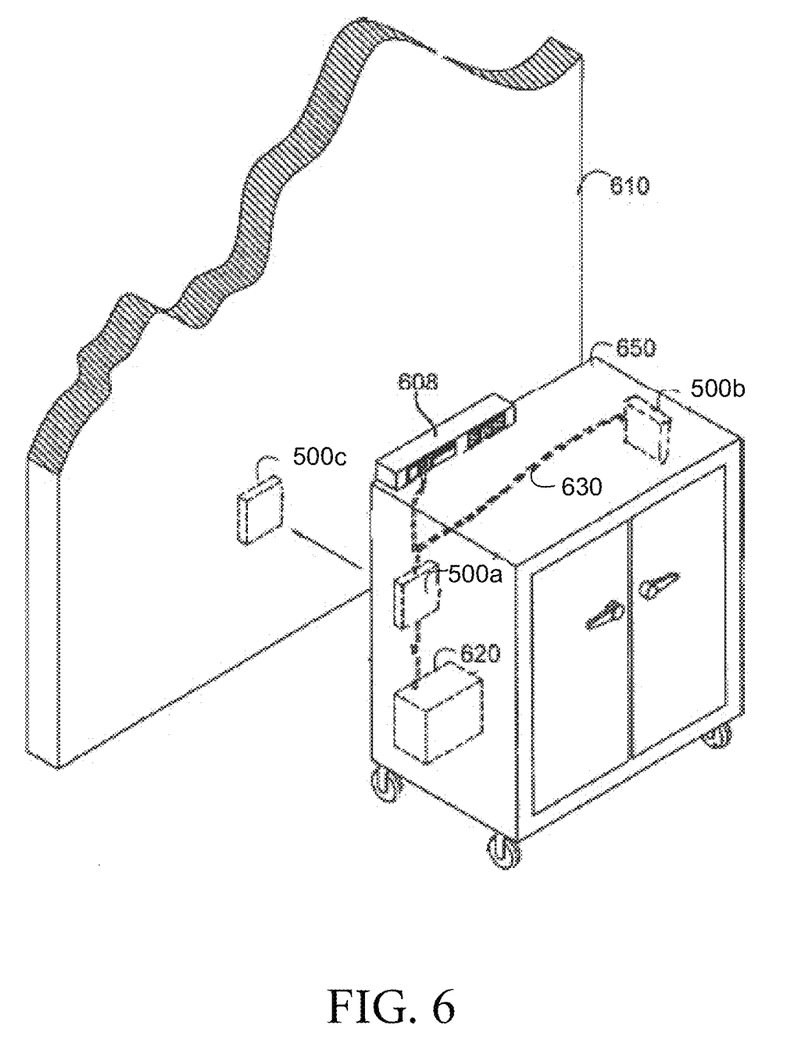
FIG. 6 is a perspective view of the wall surface and mobile furniture of FIG. 1A and of the power coupler of FIG. 5A in accordance with an embodiment of the present disclosure.

In an aspect of the present invention illustrated in FIG. 6, the equipped furniture article 150 of FIG. 1A may be a mobile cart 650 that includes a pair of power couplers 500a, 500b on different sides of the cart 650. As also illustrated in FIG. 6, the power coupler 500a is aligned for coupling with power coupler 500c mounted on the wall 610. As illustrated in FIG. 6, the cart 650 also includes a battery pack 620 so that the power outlet 608 mounted on an upper surface of the cart 650 may remain powered even when removed from the powered power coupler 500c. As also illustrated in FIG. 6, the cart power couplers 500b, 500c and power outlet 608 are interconnected by a cable assembly 630 that includes power conductors for conducting electrical power. It will be appreciated that mobile cart 650 is representative of substantially any portable article, typically a furniture article such as a table, chair, desk, partition wall, or the like, which is capable of supporting an electrical system of the type disclosed herein. Further embodiments and additional details may be found in commonly owned U.S. Patent Application Publication No. 2015/0091389, now U.S. Pat. No. 9,484,751, the disclosure of which is hereby incorporated herein by reference.

Figure 7:
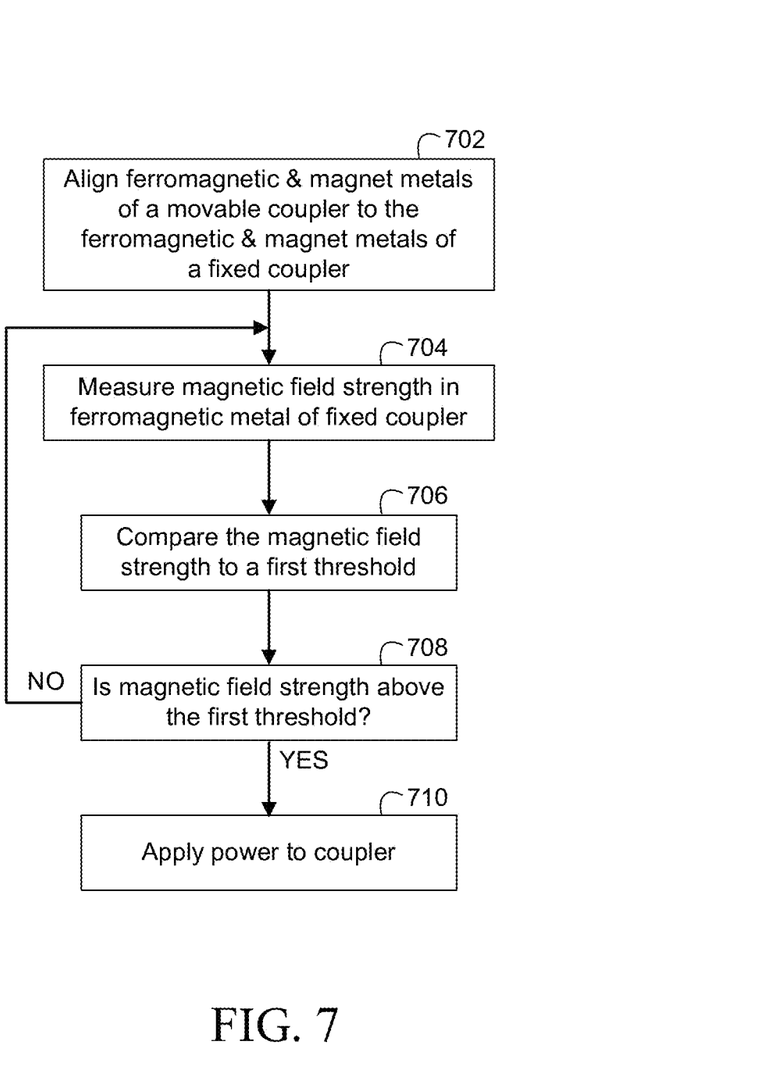
FIG. 7 is a flow diagram of a method for selectively powering an electrical power distribution system in accordance with an embodiment of the present disclosure.

FIG. 7 is a flow diagram illustrating the steps to a method for selectively powering an electrical power distribution system. In step 702 of FIG. 7, a ferromagnetic metal and magnet of a first power coupler are aligned to a ferromagnetic metal and magnet of a second power coupler. As discussed herein, in aligning the first power coupler to the second power coupler, the ferromagnetic metal of the first power coupler is aligned to the magnet of the second power coupler, while the ferromagnetic metal of the second coupler is aligned to the magnet of the first power coupler. As discussed herein, a power coupler may comprise a coupler control, a Hall Effect sensor, and a pair of electrical contacts.

In step 704 of FIG. 7, a magnetic field is measured in the ferromagnetic metal of the second power coupler. As discussed herein, the magnetic field may be measured by a Hall Effect sensor positioned near the ferromagnetic metal. In step 706 of FIG. 7, the measured magnetic field strength is compared to a first threshold. As discussed herein, the first threshold may be established such that the measured magnetic field strength is only above the first threshold when the power couplers are aligned to within a desired tolerance. In an aspect of the present invention, the desired tolerances include the power couplers aligning and centering with each other to within 5-7 millimeters in the X and Y direction.

In step 708 of FIG. 7, if the measured magnetic field strength is below the first threshold, the flow diagram continues and returns to step 704 of FIG. 7 and re-measures the magnetic field strength. If the measured magnetic field strength is above the first threshold, the flow diagram continues to step 710 of FIG. 7. In step 710 of FIG. 7, power is applied to the power coupler's electrical contacts. As discussed herein, when a power coupler control of a power coupler receives a signal from a Hall Effect sensor associated with a ferromagnetic metal of the power coupler, the coupler control switches a power source to the power coupler's electrical contacts.

Thus, the electrical power coupler and control of the present invention facilitates electrical "ganging" of furniture articles placed adjacent or in close proximity to one another, so that each furniture article may be provided with electrical power at a respective one or more outlets. In the illustrated embodiment, the electrical contacts are exposed contacts that are selectively energized at relatively low voltage, such as about 5V DC to 24V DC. The electrical contacts are energized and/or permit electrical power to flow through associated conductors when proper alignment of two compatible electrical power couplers is detected. Optionally, the controls are operable to detect when more than one power source is being coupled to a single ganged electrical system, and/or to detect when a threshold maximum number of permissible furniture articles have been electrically coupled together, in which case the system can be fully or partially de-energized.

Changes and modifications in the specifically described embodiments can be carried out without departing from the principles of the present invention which is intended to be limited only by the scope of the appended claims, as interpreted according to the principles of patent law including the doctrine of equivalents.

The embodiments of the invention in which an exclusive property or privilege is claimed are defined as follows:

1. An electrical power coupler comprising:
   a first ferromagnetic metal adjacent to a first magnet, a hall sensor operable to detect a magnetic field in the first ferromagnetic metal, and at least two first electrical contacts, each first contact coupled to a respective one of at least two power conductors that are coupled to a power source;
   a control unit in electrical communication with said power conductors, said control unit comprising an electrical switch associated with at least one of said power conductors and operable to selectively allow a flow of electricity through said power conductors when said hall sensor detects said magnetic field;
   wherein said hall sensor detects said magnetic field when said first electrical contacts are in contact with at least two second electrical contacts of an other electrical power coupler, and wherein the second electrical contacts make contact with said first electrical contacts when said first magnet is aligned with a second ferromagnetic metal of the other electrical power coupler and when a second magnet of the other electrical power coupler is aligned with said first ferromagnetic metal.

2. The electrical power coupler claimed in claim 1, wherein said hall sensor is further operable to output a signal to said control unit when said magnetic field is above a threshold level.

3. The electrical power coupler claimed in claim 2, wherein said magnetic field is above said threshold when the second electrical contacts are axially aligned with said first electrical contacts.

4. The electrical power coupler as claimed in claim 1, further in combination with the power source, wherein said power source is operable to provide direct current (DC) power.

5. The electrical power coupler as claimed in claim 1, wherein said control unit is operable to measure a current in said power conductors and to selectively prevent said flow of electricity through said power conductors when a measured current is above a current threshold.

6. The electrical power coupler as claimed in claim 1, wherein said electrical power coupler is configured for installation in one of a wall or an article of furniture.

7. An electrical power distribution system comprising:
   a first power coupler comprising a first ferromagnetic metal adjacent to a first magnet, a first hall sensor operable to detect a first magnetic field in the first ferromagnetic metal, and at least two first electrical contacts, each first contact coupled to a respective one of at least two first power conductors that are coupled to a power source;
   a first control unit in electrical communication with said first power conductors, said first control unit comprising a first electrical switch associated with at least one of said first power conductors and operable to selectively conduct a flow of electricity through said first power conductors when said first hall sensor detects said first magnetic field; and
   at least one power cable assembly comprising a second power coupler having at least two second electrical contacts and a second ferromagnetic metal adjacent to a second magnet, said second power coupler at an end portion of said power cable assembly;
   wherein said first hall sensor detects said first magnetic field when said second electrical contacts are in contact with said first electrical contacts, and wherein contacting said second electrical contacts with said first electrical contacts axially aligns said first magnet with said second ferromagnetic metal and said second magnet with said first ferromagnetic metal.

8. The electrical power distribution system as claimed in claim 7, wherein said first hall sensor is further operable to output a signal to said first control unit when said first magnetic field is above a first threshold level.

9. The electrical power distribution system as claimed in claim 8, wherein said first magnetic field is above said first threshold when said second electrical contacts are axially aligned with said first electrical contacts.

10. The electrical power distribution system as claimed in claim 7, wherein said power cable assembly further comprises at least two second power conductors coupled to said second electrical contacts, and an accessory power outlet operable to supply power to personal electronic devices via said second power conductors.

11. The electrical power distribution system as claimed in claim 7, wherein said power source is operable to provide direct current (DC) power.

12. The electrical power distribution system as claimed in claim 7, wherein said power cable assembly further comprises a third power coupler at an opposite end portion of said power cable assembly from said second power coupler, wherein said third power coupler comprises at least two third electrical contacts, a third ferromagnetic metal adjacent to a third magnet, and a third hall sensor operable to detect a magnetic field from said third ferromagnetic metal.

13. The electrical power distribution system as claimed in claim 7, wherein said first power coupler comprises said first control unit.

14. The electrical power distribution system as claimed in claim 10, wherein said second power coupler further comprises a second hall sensor and a second control unit, wherein said second hall sensor is operable to detect a second magnetic field from said second ferromagnetic metal, and wherein said second control unit is further operable to selectively allow a flow of electricity through said second power conductors via an electrical switch associated with at least one of said second power conductors when said second hall sensor detects said second magnetic field.

15. The electrical power distribution system as claimed in claim 7, wherein said first control unit is further operable to measure a current in said first power conductors and further yet operable to selectively prevent said flow of electricity through said first power conductors when a measured current is above a current threshold.

16. The electrical power distribution system as claimed in claim 7, wherein said power cable assembly is integrated into an article of furniture.

17. A method for selectively powering an electrical power distribution system, the method comprising:
   aligning a first ferromagnetic metal and a first magnet of a first power coupler to a second magnet and a second ferromagnetic metal, respectively, of a second power coupler;
   measuring, with a hall sensor, a first magnetic field strength in the second ferromagnetic metal;
   comparing, with a control unit, the first magnetic field strength to a first threshold, wherein the hall sensor is communicatively coupled to the control unit; and
   with the control unit, selectively connecting power via a power source to two second electrical contacts of the second power coupler when the first magnetic field strength is above the first threshold.

18. The method as claimed in claim 17, wherein said selectively connecting power to the second electrical contacts comprises connecting at least two power conductors from the power source to the second electrical contacts via an electric switch.

19. The method as claimed in claim 18, wherein the first magnetic field strength is above the first threshold when the second electrical contacts of the second power coupler are axially aligned with at least two first electrical contacts of the first power coupler.

20. The method as claimed in claim 19, wherein the first electrical contacts of the first power coupler are in electrical contact with the second electrical contacts of the second power coupler when the first magnet and the first ferromagnetic metal are aligned with the second ferromagnetic metal and second magnet, respectively, and wherein the electrical contacts of the second power coupler are in electrical communication with the power source via the power conductors when the power source is selectively connected to the second power coupler.

21. The method as claimed in claim 17, wherein measuring the first magnetic field strength is performed by the hall sensor positioned adjacent to the second ferromagnetic metal.

22. The method as claimed in claim 17 further comprising measuring a current in the power conductors and selectively disconnecting the power to the second electrical contacts when a measured current in the power conductors is above a current threshold.

* * * * *